(12) United States Patent
Mrusek

(10) Patent No.: US 9,788,403 B2
(45) Date of Patent: Oct. 10, 2017

(54) MEDICAL IMAGING DEVICE

(71) Applicant: KONINKLIJKE PHILIPS N.V., Eindhoven (NL)

(72) Inventor: Helmut Mrusek, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 419 days.

(21) Appl. No.: 14/383,246

(22) PCT Filed: Mar. 6, 2013

(86) PCT No.: PCT/IB2013/051785
§ 371 (c)(1),
(2) Date: Sep. 5, 2014

(87) PCT Pub. No.: WO2013/144742
PCT Pub. Date: Oct. 3, 2013

(65) Prior Publication Data
US 2015/0030134 A1    Jan. 29, 2015

Related U.S. Application Data

(60) Provisional application No. 61/615,450, filed on Mar. 26, 2012.

(51) Int. Cl.
H05G 1/26    (2006.01)
H05G 1/20    (2006.01)
H02M 1/32    (2007.01)
H02M 7/537   (2006.01)
H02M 1/00    (2006.01)
(Continued)

(52) U.S. Cl.
CPC ............... *H05G 1/20* (2013.01); *H02M 1/32* (2013.01); *H02M 7/537* (2013.01); *H05G 1/265* (2013.01); *G01R 15/181* (2013.01); *H02M 2001/0009* (2013.01); *H02M 2007/4815* (2013.01); *Y02B 70/1441* (2013.01)

(58) Field of Classification Search
CPC .................................................... H05G 1/265
See application file for complete search history.

(56) References Cited

U.S. PATENT DOCUMENTS 5,815,391 A    9/1998  Pelly
5,923,549 A    7/1999  Kobayashi et al.
(Continued)

FOREIGN PATENT DOCUMENTS

DE    19825999 A1    12/1999
DE    10244266 A1    3/2004
(Continued)

OTHER PUBLICATIONS

Palladino, L., et al.; Lasex. An X-ray source from 70 eV to 30 keV; 2009; 4th Workshop Plasma Production by Laser Ablation; pp. 229-233. www.lngs.infn.it/.
(Continued)

Primary Examiner — Thomas R Artman

(57) ABSTRACT

A medical imaging device includes an inverter with semiconductor switches for generating an AC voltage to be supplied to a load, a coil inductively coupled to a fastener that is electrically conducting, and a monitoring circuit for monitoring a current in the fastener based on a signal from the coil.

16 Claims, 2 Drawing Sheets

(51) Int. Cl.
　　　*H02M 7/48* (2007.01)
　　　*G01R 15/18* (2006.01)

(56) References Cited

U.S. PATENT DOCUMENTS

| | | | | |
|---|---|---|---|---|
| 8,588,371 | B2* | 11/2013 | Ogawa | H02M 7/53871 |
| | | | | 378/101 |
| 8,981,790 | B2* | 3/2015 | Nakamura | G01R 31/001 |
| | | | | 324/522 |
| 9,036,784 | B2* | 5/2015 | Oketa | H02H 7/122 |
| | | | | 378/109 |
| 9,107,280 | B2* | 8/2015 | Hishikawa | H01J 35/10 |
| 2003/0227730 | A1 | 12/2003 | Iimura | |
| 2009/0229650 | A1 | 9/2009 | Schroeder et al. | |
| 2010/0128505 | A1 | 5/2010 | Leppanen et al. | |
| 2010/0253367 | A1* | 10/2010 | Funato | G01R 15/148 |
| | | | | 324/654 |
| 2011/0129067 | A1 | 6/2011 | Fukuwara et al. | |
| 2011/0222651 | A1* | 9/2011 | Ogawa | H02M 7/53871 |
| | | | | 378/20 |
| 2012/0092912 | A1 | 4/2012 | Eckel | |
| 2012/0119757 | A1* | 5/2012 | Nakamura | G01R 31/001 |
| | | | | 324/613 |
| 2012/0294428 | A1* | 11/2012 | Oketa | H02H 7/122 |
| | | | | 378/109 |
| 2013/0119525 | A1 | 5/2013 | Tsuyuno | |
| 2013/0243161 | A1* | 9/2013 | Hishikawa | H01J 35/10 |
| | | | | 378/93 |
| 2015/0030134 | A1* | 1/2015 | Mrusek | H05G 1/20 |
| | | | | 378/105 |

FOREIGN PATENT DOCUMENTS

| | | |
|---|---|---|
| JP | 64040182 A | 2/1989 |
| JP | 7255182 A | 10/1995 |
| JP | 9147690 A | 6/1997 |
| JP | 2001320829 A | 11/2001 |

OTHER PUBLICATIONS

Poncelas, O., et al.; Motor Fault Detection Using a Rogowski Sensor Without an Integrator; 2009; IEEE Trans. on Industrial Electronics; 56(10)4062-4070.

Votzi, H. L., et al.; Low-Cost Current Sensor for Power Capacitors Based on a PCB Rogowski-Coil; 2011; PCIM Europe; pp. 621-626.

* cited by examiner

MEDICAL IMAGING DEVICE

CROSS REFERENCE TO RELATED APPLICATIONS

This application is a national filing of PCT application Ser. No. PCT/IB2013/051785, filed Mar. 6, 2013, published as WO 2013/144742 A1 on Oct. 3, 2013, which claims the benefit of U.S. provisional application ser. no. 61/615,450 filed Mar. 26, 2012, which is incorporated herein by reference.

FIELD OF THE INVENTION

The invention relates to a medical imaging device and to a method for operating a medical imaging device.

BACKGROUND OF THE INVENTION

Usually in an X-ray device like a CT (computer tomograph), a voltage from an electrical grid is transformed in a high voltage that is supplied to an X-ray tube. The high voltage generator may comprise an inverter in which IGBTs or MOSFETs are used as switching elements.

Also in other medical imaging devices like MRTs (magnet resonant tomographs) a similar inverter may be used for generating the supply current of the coils generating the magnetic field for measurements.

In such an inverter the short circuit or over-current detection may be realized by monitoring the voltage across the switching element. The voltage across the switching element may be a good indicator of the current flowing through the switching element, since as a rule, as higher the current as higher the voltage across the switching element.

In medical imaging devices, in particular for reducing the weight of movable components (for example a gantry or arm with a detector), the inverters may be operated with a high frequency (up to 100 kHz or higher), since the weight of components like transformers and inductors may be reduced with raising frequency. Also full resonant high frequency modes are used, in which a resonant load is coupled with the inverter for producing a more sinusoidal output current.

SUMMARY OF THE INVENTION

If the inverter is operated in full resonant high frequency mode, with the monitoring of the collector-emitter voltage of the switching element the current may be only properly measured after a certain delay. Further, parasitic inductances may cause problems to monitor the current as they may distort the relationship between voltage and current.

It may be an object of the invention to provide a medical imaging device with accurate over-current detection.

This object is achieved by the subject-matter of the independent claims. Further exemplary embodiments are evident from the dependent claims and the following description.

An aspect of the invention relates to a medical imaging device, for example an X-ray, CT or MRT device.

According to an embodiment of the invention, the medical imaging device comprises an inverter with semiconductor switches for generating an AC voltage to be supplied to a load; a coil inductively coupled to a conductor of the inverter connected with a semiconductor switch of the inverter; and a monitoring circuit for monitoring a current in the semiconductor switch with a signal from the coil. For example, the coil may be an air coil or Rogowski coil.

It may be seen as a gist of the invention that a signal from a coil inductively coupled to a supply line of a semiconductor switch may be used for over-current detection in the semiconductor switch. In particular, the over-current detection may be particularly accurate for a high speed switching inverter. For example, the semiconductor switch may be an IGBT, and the coil may be arranged around the collector-emitter path of the IGBT.

A further aspect of the invention relates to a method for operating a medical imaging device, for example the medical imaging device as described in the above and in the following.

According to an embodiment of the invention, the method comprises the steps of: switching semiconductor switches of an inverter of the medical imaging device for generating an AC voltage to be supplied to a load; generating a signal in a coil inductively coupled to a conductor of the inverter connected with a semiconductor switch of the inverter; and determining a current signal for the semiconductor switch from the signal of the coil.

It has to be understood that features of the method as described in the above and in the following may be features of the system as described in the above and in the following.

These and other aspects of the invention will be apparent from and be elucidated with reference to the embodiments described hereinafter.

BRIEF DESCRIPTION OF THE DRAWINGS

Below, embodiments of the present invention are described in more detail with reference to the attached drawings.

DETAILED DESCRIPTION OF EMBODIMENTS

Figure 1:
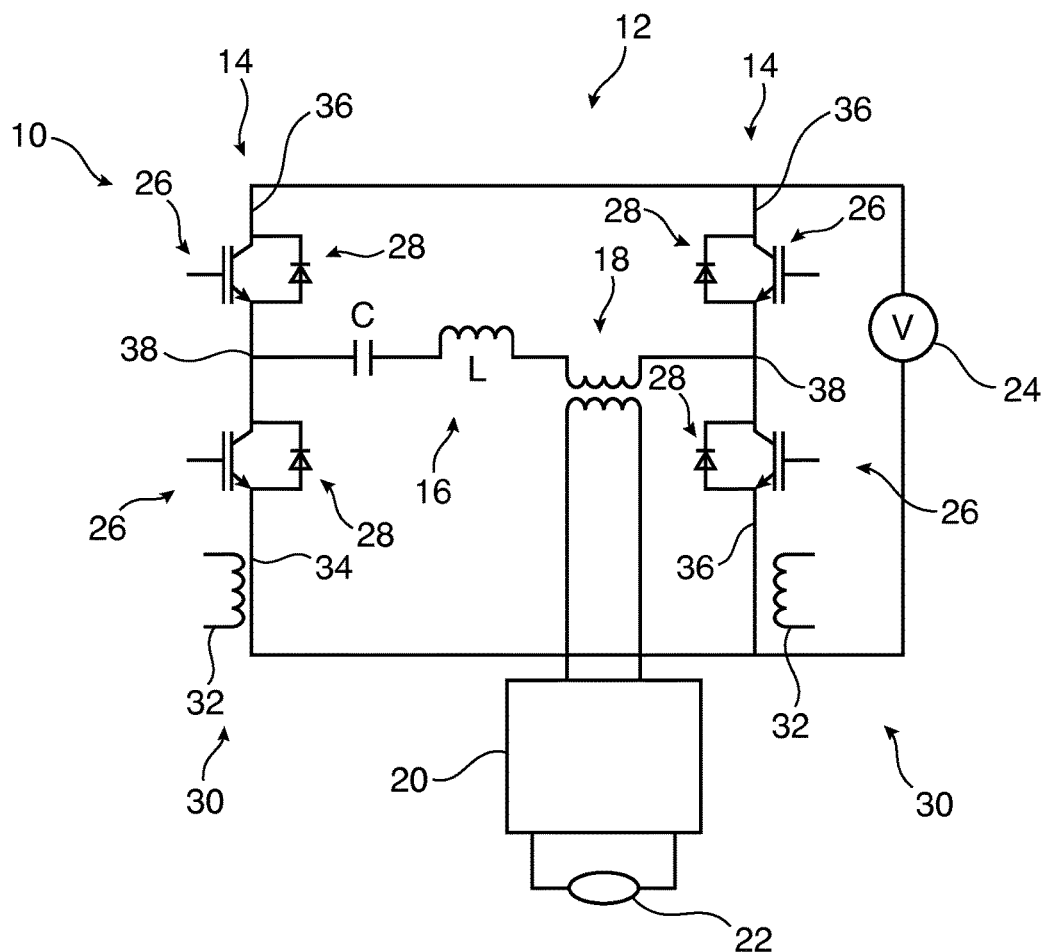
FIG. 1 schematically shows a medical imaging device according to an embodiment of the invention.

FIG. 1 shows a medical imaging device 10 comprising an inverter 12 with two inverter legs 14, a resonance circuit 16 and a transformer 18. In the case the medical imaging device is an X-ray device, it may further comprise a high voltage generator 20, and an X-ray tube 22. If the medical imaging device 10 is a MRT, the components 20, 22 may comprise a coil 22 for generating a magnetic field, which is used for performing the measurements of the MRT 10. In both cases, the AC current from the transformer 18 is used for supplying a load 20, 22.

The inverter legs 14 are connected in parallel to a voltage source 24, for example a DC link. Each inverter leg 14 comprises two semiconductor switches 26, for example IGBTs 26 or MOSFETs 26, connected in series. A freewheeling diode 28 is connected in parallel to each semiconductor switch 26.

The resonance circuit 16 and the transformer 18 are connected with the inverter legs 14 between the semiconductor switches 24. The resonance circuit 16 has a capacitor C and an inductance L connected in series with transformer 18.

The inverter 12 is adapted for transforming a DC voltage from the voltage source 24 into an AC voltage at the transformer 18. The AC voltage is generated by switching the semiconductor switches 26 with a gate drive. The pulse-shaped voltage at the output 38 of the inverter legs 14 is transformed into a sinusoidal AC voltage by the resonance circuit 16.

The transformer 18 is adapted for transforming the AC voltage from the inverter into an AC voltage of a higher voltage that is supplied to the load 20, 22, for example, the high voltage generator 20, which may comprise a high voltage cascade that supplies the X-ray tube 22 with a DC voltage.

The semiconductor switches 26 may be situated in a semiconductor module 30. Such a semiconductor module 30 may house one or both of the semiconductor switches 26 of an inverter leg 14 and optionally the corresponding free-wheeling diodes 28.

According to an embodiment of the invention, the medical imaging device 10 comprises an inverter 12 with semiconductor switches 26 for generating an AC voltage to be supplied to a load 20, 22.

According to an embodiment of the invention, the medical imaging device 10 comprises a resonance circuit 16 connected to an output 38 of the inverter 12. The resonance circuit 16 may be seen as a resonant load on the inverter 12.

According to an embodiment of the invention, the medical imaging device 10 comprises a transformer 18 for transforming the AC voltage from the inverter 12 into a first higher AC voltage.

According to an embodiment of the invention, the medical imaging device 10 comprises a high voltage generator 20 for generating a second higher voltage to be supplied to the X-ray tube 22.

According to an embodiment of the invention, the semiconductor switches 26 comprise an IGBT.

Furthermore, each inverter leg 14 is inductively coupled with a coil 32 for over-current detection. As shown in FIG. 1, the coil 32 may be coupled with the negative input 34 of the inverter leg 14. However, the coil 32 may also be coupled with the positive input 36 or with the output 38, i.e. between the semiconductor switches 26. The inputs 34, 36 and the output 38 may comprise electrical conductors like lines, cables or bus bars.

According to an embodiment of the invention, the medical imaging device 10 comprises a coil 32 inductively coupled to a conductor 34, 36, 38 of the inverter 12 connected with a semiconductor switch 26 of the inverter 12.

According to an embodiment of the invention, the inverter 12 comprises an inverter leg 14 with at least two semiconductor switches 26, and the coil 32 is coupled to an input 34, 36 or an output 38 of the inverter leg 14. According to an embodiment of the invention, a coil 32 for current monitoring is inductively coupled to each inverter leg 14 of the inverter 12.

Figure 2:
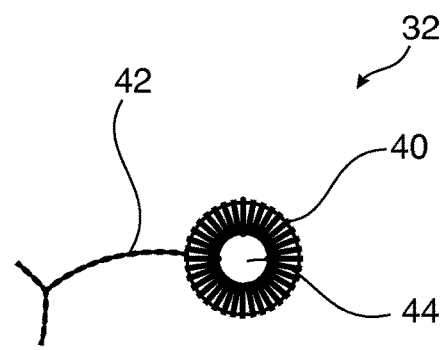
FIG. 2 shows a three-dimensional view of a coil of the medical imaging device of FIG. 1.

FIG. 2 shows a coil 32 that may be used for over-current detection in the medical imaging device 10. The coil 32 shown in FIG. 2 is a toroidal coil 32, also known as Rogowski coil 32. The coil 32 may have a toroidal core 40, which may be ferromagnetic. The conductor 42 of the coil 32 may be wound around the toroidal core. The coil 32 may be an air coil 32.

For measuring a current in a conductor 34, 36, 38, the conductor 34, 36, 38 is guided through the opening 44 that is surrounded by the coil 32.

According to an embodiment of the invention, the coil 32 is a toroidal coil surrounding the conductor 34, 70.

Figure 3:
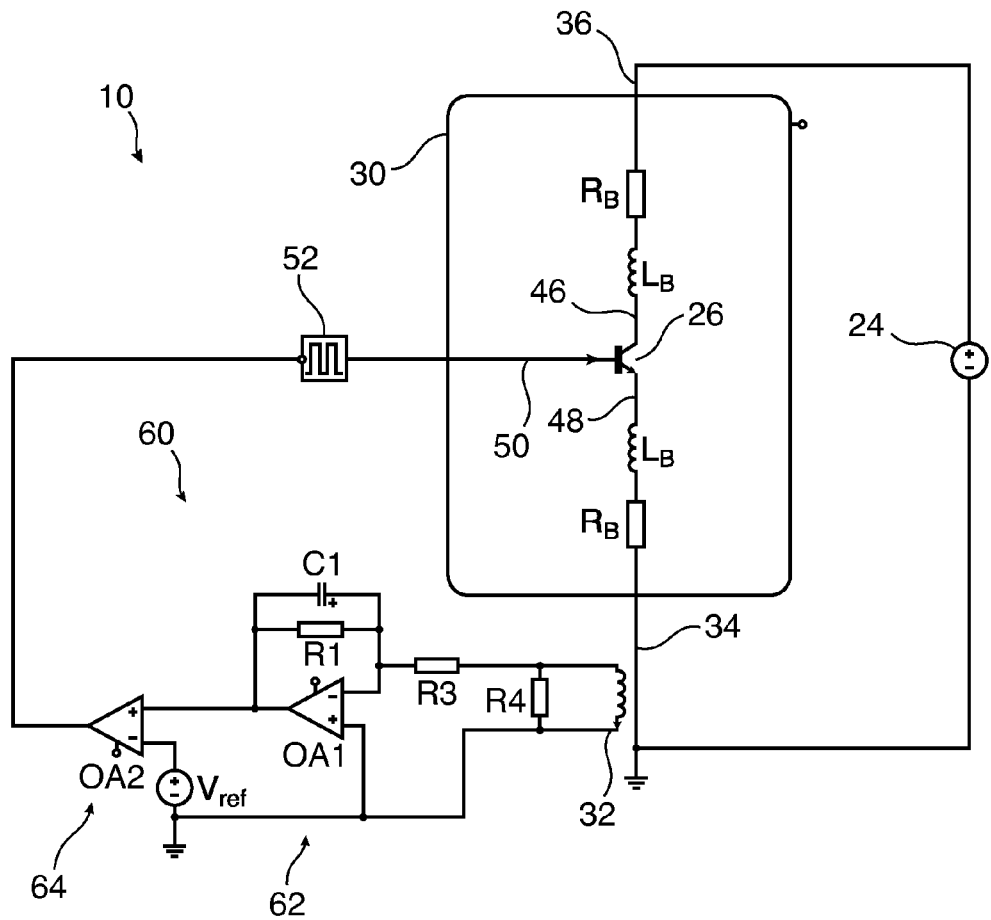
FIG. 3 schematically shows a detail of the medical imaging device of FIG. 1.

FIG. 3 shows a semiconductor module 30 of the medical imaging device 10 that is coupled with a coil 32. For example, the semiconductor module 30 is an IGBT module 30 housing an IGBT 26. The collector 46 and the emitter 48 of the IGBT 26 are connected via bond wires with the inputs 34, 36 of the module 30, which have a parasitic resistance $R_B$ and a parasitic inductance $L_B$.

According to an embodiment of the invention, the coil 32 is inductively coupled to a conductor 34, 36 connected with the emitter 46 or collector 48 of an IGBT 26.

According to an embodiment of the invention, the coil 32 is inductively coupled to a conductor 34, 36 connected via bond wires to the semiconductor switch 26.

The gate 50 of the IGBT 26 is connected to the gate drive 52 that is controlling the inverter 12.

One way of monitoring the current $I_{CE}$ through the semiconductor switch 26 is to monitor the voltage $V_{CE}$ between the inputs 34, 36. However, when using the $V_{CE}$ monitoring method in a full resonant high frequency inverter using IGBTs 26 as switching elements 26, several problems may arise.

The IGBT 26 may need time to actually reach its specified $V_{CE}$ voltage. In other words, the $V_{CE}$ voltage may only slowly decrease with increasing load current. The decrease may last up to 3 µs, depending on the used type of IGBT 26. Assuming a 100 kHz inverter 12 with a period of 10 µs (or a half wave of 5 µs), the switching IGBT 26 may just reach its specified $V_{CE}$ at the end of the switching operation (for example assuming a 3 µs conductivity modulation).

The parasitic inductances $L_B$ of the IGBT module 30 (for example collector-emitter inductances due to bonding wires) may cause a voltage drop. Since the change of the current (di/dt) in the inverter 12 at high frequencies, for example in high frequency full resonant mode, may be quite high, the resulting voltage drop may add up to the measured $V_{CE}$. The measured voltage $V_{CEmeasured}$ may be the sum of the voltage drop and the actual voltage $V_{CE}$ at the semiconductor 26:

$$V_{CEMeasured} = L_{Bond} * \frac{di}{dt} + V_{CE}$$

The monitoring of the actual $V_{CE}$ voltage at the IGBT 26 itself may become complicated, because of the additional voltage drop caused by the high frequency sine wave current.

With the coil 32 placed in the collector-emitter path of the IGBT 26, a further method of monitoring the current $I_{CE}$ may be performed. In particular, the collector-emitter current $I_{CE}$ through the IGBT 26 may be directly monitored, which may overcome the drawback of the above mentioned $V_{CE}$ saturation method, because the current $I_{CE}$ itself is monitored.

In particular, in medical imaging devices 10 adapted for computer tomography (CT) that may have a moving arm or a moving X-ray-source/detector arrangement and magnet resonance tomography (MRT), the weight of the electrical equipment is proportional to the frequency of the generated high voltage. In these cases, the inverter 12 may be configured to produce an output voltage of a frequency up to 100 kHz or more, and the monitoring of the current $I_{CE}$ with the coil 32 may be advantageous.

According to an embodiment of the invention, semiconductor switches 26 of an inverter 12 of the medical imaging device 10 are switched for generating an AC voltage to be supplied to a load.

According to an embodiment of the invention, the semiconductor switches 26 are switched such that the frequency of the AC voltage is above 10 kHz, for example above 30 kHz.

According to an embodiment of the invention, the semiconductor switches 26 are switched such that the inverter 12 is operated in a resonant mode.

For processing the signal of the coil 32, the X-ray device 10 comprises further a current monitoring circuit 60 or an over-current detection circuit 60 with an integrator 62 and a comparator 64.

According to an embodiment of the invention, the medical imaging device 10 comprises a monitoring circuit 60 for monitoring a current in the conductor 34, 36, 38 by determining the current from a signal from the coil 32. The signal from the coil 32 may be a voltage and/or current induced in the coil by the current $I_{CE}$. The conductor 34, 36, 38 may be an electrical line, in particular a line interconnecting a semiconductor switch 26 with an input 34, 36 of the inverter 12.

The integrator 62 comprises an operational amplifier OA1. The inverting input, and the output of the operational amplifier OA1 are connected with a resistance R1 and a capacitor C1 in parallel. A shunt resistor R4 in parallel with the coil 32 transforms a current in the coil 32 into a voltage that is supplied to the operational amplifier OA1. This voltage signal of the coil 32 is supplied via a resistor R3 to the inverting input of the operational amplifier OA1 and directly to the non-inverting input. The signal of the coil 32 is proportional to the change of the collector-emitter current $I_{CE}$. The integrator 62 may be used for summing up the coil signal to transform it into a signal proportional to the current $I_{CE}$.

According to an embodiment of the invention, the monitoring circuit 60 comprises an integrator 62 for integrating the signal from the coil 32.

The comparator 64 comprises an operational amplifier OA2 with the non-inverting input connected to the output of the operational amplifier. The inverting input of the operational amplifier OA2 is connected to a reference voltage $V_{Ref}$.

The signal produced by the coil 32 is proportional to di/dt of the collector-emitter current $I_{CE}$ through the IGBT. The integrator 52 (and other signal conditioning if necessary, e.g. amplifier, inverter, etc.) after the coil 32 transfers the di/dt signal to a current signal, which is proportional to the current $I_{CE}$ through the IGBT 26.

The comparator 64 compares the current signal to the reference signal $V_{Ref}$. The resulting signal is supplied to the gate drive 52, which in case that an over-current is detected, switches off the IGBT 26.

According to an embodiment of the invention, the monitoring circuit 60 comprises a comparator 64 for comparing the integrated signal with a reference signal $V_{Ref}$.

It has to be noted, that alternatively, the module 30 may house one or more MOSFETs 26. In this case, in the above and in the following, the current $I_{CE}$ may be substituted by a current $I_{DS}$ (a drain-source current), and the voltage $V_{CE}$ by $V_{DS}$ (a drain-source voltage).

Summarized, during the operation of the medical imaging device 10, in which the inverter 12 is switched by the gate drive 52 to generate an AC output current, the current $I_{CE}$ may be monitored and an over-current in a semiconductor switch 26 may be determined.

According to an embodiment of the invention, a signal is generated in a coil 32 inductively coupled to a conductor 34, 36, 38 of the inverter 12 connected with a semiconductor switch 26 of the inverter 12.

According to an embodiment of the invention, a current signal is determined from the signal of the coil 32, wherein the current signal indicates or is proportional to a current in the semiconductor switch 26.

According to an embodiment of the invention, the current signal is determined by integrating the voltage signal from the coil 32.

According to an embodiment of the invention, an over-current is detected by comparing the integrated signal with a reference signal $V_{Ref}$.

Figure 4:
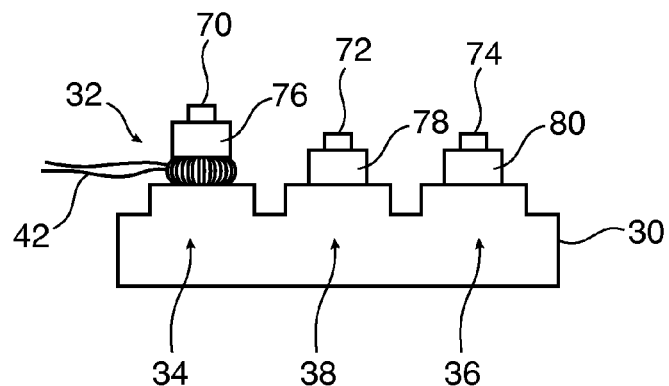
FIG. 4 schematically shows a side view of a semiconductor module according to an embodiment of the invention.

FIG. 4 schematically shows a side view of a semiconductor module 30. For example, the semiconductor module 30 may house the two semiconductor switches 26 of an inverter leg 14.

Each of the inputs/outputs 34, 36, 38 of the semiconductor module 30 are connected via a mechanical connector 70, 72, 74, for example a screw, with a supply line 76, 78, 80, for example a bus bar, a copper bar, cable or a circuit board.

The mechanical connector 70 is electrically conducting, and the coil 32 is placed between the supply line 76 and the module 30. Thus, the mechanical connector 70 fixes the coil 32 and the supply line 76 to the module 34, and the coil 32 is adapted for monitoring the current $I_{CE}$ from the supply line 76 through the mechanical connector 76 in the module 30.

According to an embodiment of the invention, the medical imaging device 10 comprises a semiconductor module 30 housing at least one semiconductor switch 26.

According to an embodiment of the invention, the coil 32 is inductively coupled with a conductor 70 at an input 34 of the semiconductor module 30.

According to an embodiment of the invention, a supply line 76 of the semiconductor module 30 is connected to the semiconductor module 30 with a mechanical connector 70.

According to an embodiment of the invention, the mechanical connector 70 is electrically conducting, and the coil 32 is arranged around the mechanical connector 70.

According to an embodiment of the invention, the coil 32 is accommodated between the supply line 76 and an output of the semiconductor module 30, and the mechanical connector 70 fastens the coil 32 to the semiconductor module 30.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A medical imaging device, comprising:
   a semiconductor module including an inverter having semiconductor switches, the inverter being configured to generate an AC voltage;
   a load configured to consume the AC voltage for generating an image for output by the medical imaging device;

a coil configured to provide a signal indicative of a current in a semiconductor switch of the semiconductor switches;

a mechanical fastener configured to fasten the semiconductor module to a supply line of the semiconductor module, the mechanical fastener being further configured to fasten the semiconductor module to the coil, wherein the mechanical fastener is electrically conducting; and a monitoring circuit configured to monitor the current in the semiconductor switch based on the signal from the coil, wherein the coil is inductively coupled to the mechanical fastener, wherein the coil is arranged between the semiconductor module and the supply line, and wherein the coil is arranged around the mechanical fastener for sensing a current through the mechanical fastener and providing the signal indicative of the current in the semiconductor switch.

2. The medical imaging device of claim 1,
wherein the coil is a toroidal coil surrounding the mechanical fastener.

3. The medical imaging device of claim 1,
wherein the semiconductor switches comprise an insulated-gate bipolar transistor (IGBT).

4. The medical imaging device of claim 1,
wherein the inverter comprises an inverter leg with at least two semiconductor switches, and
wherein the mechanical fastener is configured to fasten the supply line to an input of the inverter leg.

5. The medical imaging device of claim 1,
wherein the inverter comprises an inverter leg with at least two semiconductor switches, and
wherein the mechanical fastener is configured to fasten the supply line to an output of the inverter leg.

6. The medical imaging device of claim 1, wherein:
the semiconductor module houses the monitoring circuit and the inverter including the semiconductor switches, and
the coil is inductively coupled to the mechanical fastener at an input of the semiconductor module.

7. The medical imaging device of claim 1,
wherein the coil is accommodated between the supply line and an input of the semiconductor module, and wherein the mechanical fastener fastens the coil to the input of the semiconductor module.

8. The medical imaging device of claim 1,
wherein the monitoring circuit comprises an integrator for integrating the signal from the coil
to produce an integrated signal.

9. The medical imaging device of claim 1, further comprising:
a resonance circuit connected to an output of the inverter.

10. The medical imaging device of claim 1, further comprising:
a transformer for transforming the AC voltage from the inverter into a first higher AC voltage higher than the AC voltage; and
a high voltage generator for generating a second higher voltage, higher than the first higher AC voltage, to be supplied to an X-ray tube for generating the image for output by the medical imaging device.

11. The medical imaging device of claim 1, wherein the mechanical fastener is a screw.

12. A method for operating a medical imaging device, the method comprising acts of:
switching semiconductor switches of an inverter housed on a semiconductor module of the medical imaging device for generating an AC voltage;
supplying the AC voltage to a load for generating an image for output by the medical imaging device;
generating a signal in a coil indicative of a current in a semiconductor switch of the semiconductor switches;
fastening by a fastener the semiconductor module to the coil and to a supply line of the semiconductor module, wherein the fastener is electrically conducting;
inductively coupling the coil to the fastener, wherein the coil is arranged between the semiconductor module and the supply line, and wherein the coil is further arranged around the mechanical fastener for sensing a current through the mechanical fastener and providing the signal indicative of the current in the semiconductor switch; and
determining a current signal based on the signal of the coil, the current signal indicating the current in the semiconductor switch.

13. The method of claim 12,
wherein the switching act switches the semiconductor switches such that a frequency of the AC voltage is above 10 kHz.

14. The method of claim 12, further comprising acts of:
determining the current signal by integrating the signal from the coil to produce an integrated signal; and
detecting an over-current by comparing the integrated signal with a reference signal.

15. The medical imaging device of claim 8, wherein the monitoring circuit comprises a comparator for comparing the integrated signal with a reference signal.

16. The method of claim 12, wherein the switching act switches the semiconductor switches such that the inverter is operated in a resonant mode.

* * * * *